(12) United States Patent
Na et al.

(10) Patent No.: US 11,282,679 B2
(45) Date of Patent: Mar. 22, 2022

(54) PLASMA CONTROL APPARATUS AND PLASMA PROCESSING SYSTEM INCLUDING THE SAME

(71) Applicant: Samsung Electronics Co., Ltd., Suwon-si (KR)

(72) Inventors: Donghyeon Na, Hwaseong-si (KR); Hyosin Kim, Suncheon-si (KR); Seungbo Shim, Seoul (KR); Hadong Jin, Hwaseong-si (KR); Dougyong Sung, Seoul (KR); Minyoung Hur, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 28 days.

(21) Appl. No.: 16/870,186

(22) Filed: May 8, 2020

(65) Prior Publication Data

US 2020/0373126 A1 Nov. 26, 2020

(30) Foreign Application Priority Data

May 22, 2019 (KR) .................... 10-2019-0060218
Sep. 6, 2019 (KR) .................... 10-2019-0110941

(51) Int. Cl.
*H01J 37/32* (2006.01)
*H03H 7/40* (2006.01)
*H03H 7/01* (2006.01)

(52) U.S. Cl.
CPC ... *H01J 37/32183* (2013.01); *H01J 2237/334* (2013.01); *H03H 7/0115* (2013.01); *H03H 7/40* (2013.01)

(58) Field of Classification Search
CPC .... H01J 37/32; H01J 37/321; H01J 37/32174; H01J 37/32183; H03H 7/38; H03H 7/40; H03H 7/1758; H03H 7/0115
See application file for complete search history.

(56) References Cited

U.S. PATENT DOCUMENTS

| 5,187,457 | A | 2/1993 | Chawla et al. |
| 7,004,107 | B1 * | 2/2006 | Raoux .............. C23C 16/45565 118/663 |
| 7,611,603 | B2 * | 11/2009 | Yamazawa ........ H01J 37/32183 118/723 E |
| 8,080,479 | B2 | 12/2011 | Collins et al. |

(Continued)

FOREIGN PATENT DOCUMENTS

KR 20120007864 A 1/2012

*Primary Examiner* — Thai Pham
(74) *Attorney, Agent, or Firm* — Harness, Dickey & Pierce, P.L.C.

(57) ABSTRACT

A plasma control apparatus for controlling plasma to be uniformly distributed in a plasma chamber and a plasma processing system including the same are provided. The plasma control apparatus includes a transmission line configured to deliver radio frequency (RF) power to a plasma chamber through at least two frequencies, a matching circuit configured to control impedance for maximum delivery of the RF power, and a plasma control circuit configured to selectively and independently control harmonics at a very high frequency (VHF) among the at least two frequencies and to control plasma distribution in the plasma chamber by producing resonance for the harmonics.

20 Claims, 13 Drawing Sheets

(56) References Cited

U.S. PATENT DOCUMENTS

| | | | |
|---|---|---|---|
| 8,689,733 B2 * | 4/2014 | Koshimizu | H01J 37/32082 |
| | | | 118/723 E |
| 8,920,611 B2 | 12/2014 | Forster et al. | |
| 9,385,021 B2 | 7/2016 | Chen et al. | |
| 9,761,414 B2 | 9/2017 | Marakhtanov et al. | |
| 9,881,772 B2 * | 1/2018 | Marakhatanov | H01J 37/32091 |
| 2011/0005679 A1 | 1/2011 | Hanawa et al. | |
| 2012/0074844 A1 * | 3/2012 | York | H03H 7/40 |
| | | | 315/111.21 |
| 2015/0224515 A1 * | 8/2015 | Baumgartner | B01D 53/32 |
| | | | 95/3 |
| 2016/0071701 A1 * | 3/2016 | Lane | H01J 37/32174 |
| | | | 156/345.28 |

* cited by examiner

PLASMA CONTROL APPARATUS AND PLASMA PROCESSING SYSTEM INCLUDING THE SAME

CROSS-REFERENCE TO RELATED APPLICATIONS

This application claims the benefit of Korean Patent Application Nos. 10-2019-0060218, filed on May 22, 2019 and 10-2019-0110941, filed on Sep. 6, 2019, in the Korean Intellectual Property Office, the disclosures of each of which are incorporated herein in their entirety by reference.

BACKGROUND

The inventive concepts relate to a plasma processing system, and more particularly, to an apparatus for controlling plasma distribution in a plasma chamber and a plasma processing system including the apparatus.

In general, a series of processes, such as vapor deposition, etching, and cleaning, may be performed to manufacture semiconductor devices. Such a process may be performed by a vapor deposition apparatus, an etching apparatus, or a cleaning apparatus, each including a process chamber. To improve selectivity and minimize damage to a membrane, plasma technology, such as capacitive coupled plasma (CCP), inductive coupled plasma (ICP), or a combination of CCP and ICP, is used. Plasma technology includes direct plasma technology for directly generating plasma in a process chamber, e.g., a wafer processing space, and remote plasma technology for generating plasma outside a process chamber and supplying the plasma to the process chamber.

SUMMARY

The inventive concepts provide a plasma control apparatus for controlling plasma to be uniformly distributed in a plasma chamber and a plasma processing system including the same.

According to an aspect of the inventive concepts, there is provided a plasma control apparatus including a transmission line configured to deliver radio frequency (RF) power to a plasma chamber through at least two frequencies, a matching circuit configured to control impedance for maximum delivery of the RF power, and a plasma control circuit configured to selectively and independently control harmonics at a very high frequency (VHF) among the at least two frequencies, and to control circuit control plasma distribution in the plasma chamber by producing resonance for the harmonics.

According to another aspect of the inventive concepts, there is provided a plasma control apparatus including a plasma control circuit configured to control plasma distribution in a plasma chamber using resonance for harmonics at a very high frequency (VHF), the plasma control circuit including a resonance circuit configured to produce resonance for harmonics at a very high frequency (VHF) among frequencies of radio frequency (RF) power delivered to a plasma chamber and a filter circuit configured to perform filtering on a fundamental and harmonics with respect to the frequencies of the RF power.

According to still another aspect of the inventive concepts, there is provided a plasma processing system including a radio frequency (RF) power source configured to generate RF power having at least two frequencies, a plasma chamber configured to allow plasma to be generated therein, a transmission line configured to deliver the RF power to the plasma chamber, a matching circuit configured to control impedance of the RF power, and a plasma control circuit configured to selectively and independently control harmonics at a very high frequency (VHF) among the at least two frequencies, and to control plasma distribution in the plasma chamber by producing resonance for the harmonics.

According to yet another aspect of the inventive concepts, there is provided a plasma control apparatus including a transmission line configured to deliver radio frequency (RF) power to a plasma chamber through at least two frequencies, a matching circuit configured to control impedance of the RF power, a first plasma control circuit configured to selectively and independently control harmonics at a very high frequency (VHF) among the at least two frequencies and to control plasma distribution in the plasma chamber by producing resonance for the harmonics, and a second plasma control circuit configured to control characteristic impedance of an edge region adjacent to an edge ring of an electrostatic chuck of the plasma chamber.

According to a further aspect of the inventive concepts, there is provided a plasma processing system including a radio frequency (RF) power source configured to generate RF power having at least two frequencies, a plasma chamber configured to allow plasma to be generated therein, a transmission line configured to deliver the RF power to the plasma chamber, a matching circuit between the RF power source and the plasma chamber and configured to control impedance for maximum delivery of the RF power, a first plasma control circuit between the matching circuit and the plasma chamber and connected to an electrode portion of an electrostatic chuck of the plasma chamber, the first plasma control circuit includes a first resonance circuit and a first filter circuit, the first resonance circuit including a variable capacitor and an inductor, and a second plasma control circuit connected to a conductive ring surrounding the electrode portion, the second resonance circuit including two capacitors, a variable capacitor, and an inductor.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1A:
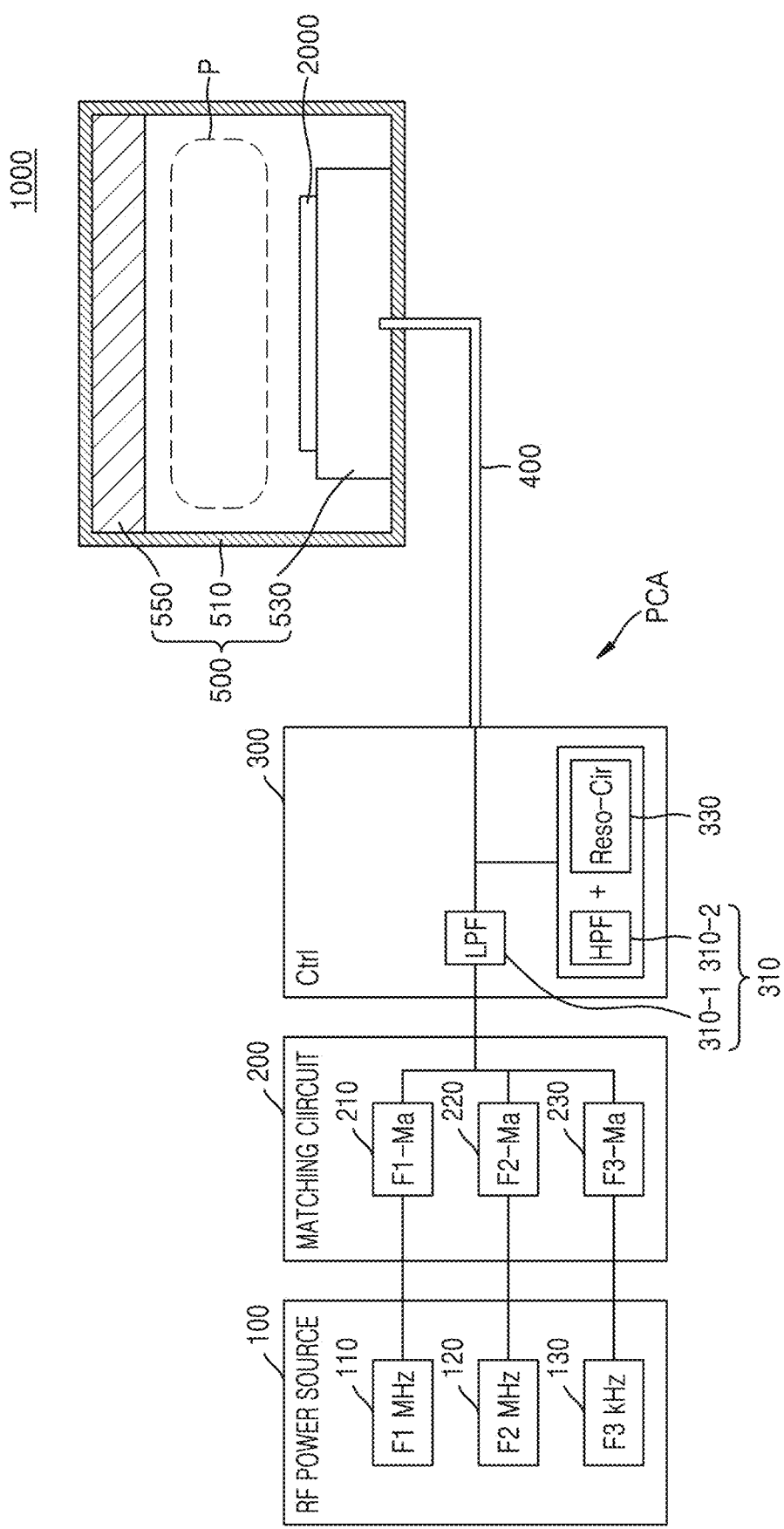
FIGS. 1A through 1C are a block diagram and circuit diagrams of a plasma processing system according to an example embodiment.

The inventive concepts will now be described more fully with reference to the accompanying drawings Like reference numerals in the drawings denote like elements, and thus their description will be omitted.

Figure 1B:
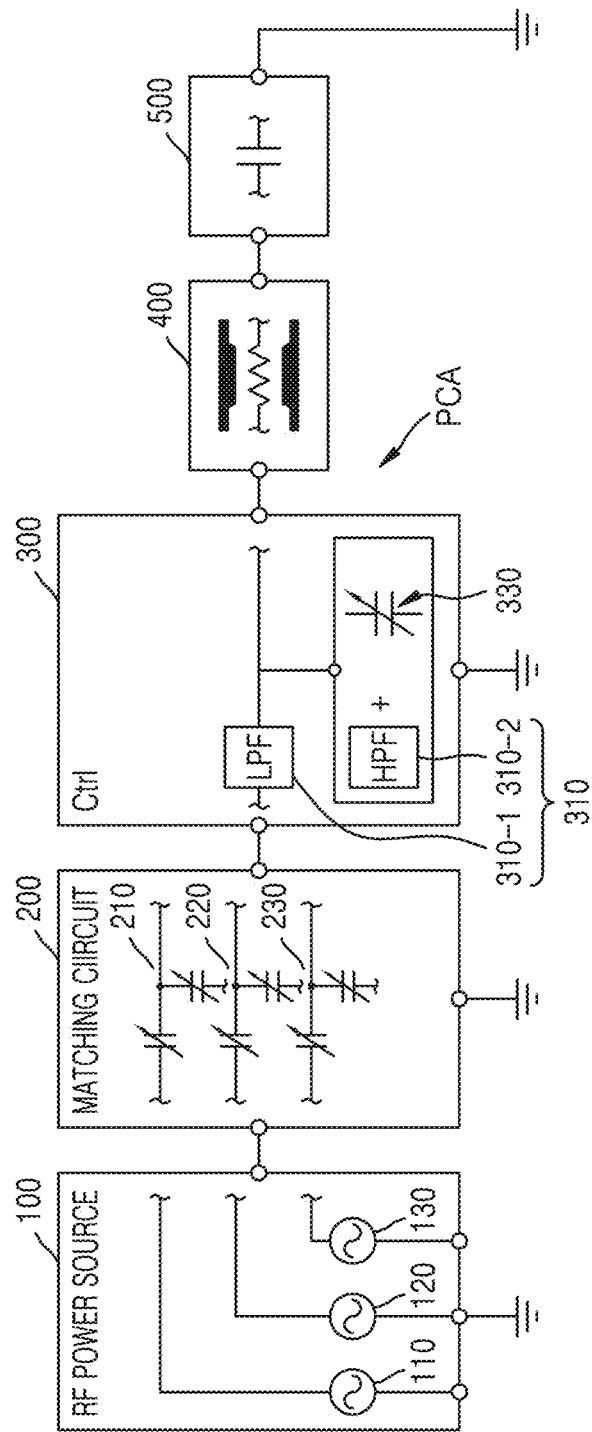
Figure 1C:
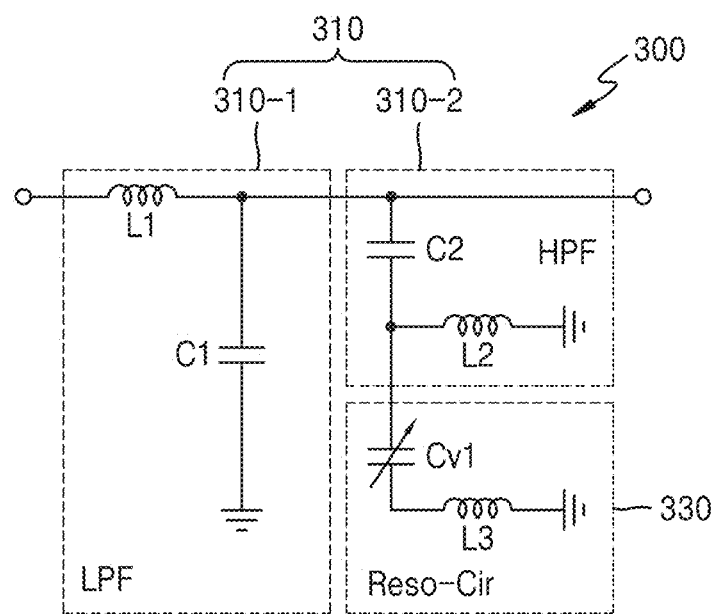

FIGS. 1A through 1C are a block diagram and circuit diagrams of a plasma processing system 1000 according to an example embodiment.

Referring to FIGS. 1A through 1C, the plasma processing system 1000 may include a radio frequency (RF) power source 100, a matching circuit 200, a plasma control circuit 300, a transmission line 400, and a plasma chamber 500.

The RF power source 100 may generate and supply RF power to the plasma chamber 500. The RF power source 100 may generate and output RF power having various frequencies. For example, the RF power source 100 may include three sources, e.g., a first source 110, a second source 120, and a third source 130. Here, the first source 110 may generate RF power having a first frequency F1 MHz ranging from several MHz to several tens of MHz. For example, the first frequency F1 MHz may include a range of frequencies greater than 1 MHz and less than 100 MHz. The second source 120 may generate RF power having a second frequency F2 MHz ranging from several hundredths of a MHz to several MHz (e.g., several hundreds of a kHz to several MHz). For example, the second frequency F2 MHz range may include a range of frequency greater than 100 kHz and less than 10 MHz. The third source 130 may generate RF power having a third frequency F3 kHz ranging from several tens of kHz to several hundreds of kHz. For example, the third frequency F3 kHz may include a range of frequencies greater than 10 kHz and less than 1 MHz. In addition, each of the three sources (e.g., the first through third sources 110, 120, and 130) of the RF power source 100 may generate and output power ranging from several hundreds of watts (W) to several tens of thousands of W.

Although the RF power source 100 of the plasma processing system 1000 includes three sources (e.g., the first through third sources 110, 120, and 130), the number of sources included in the RF power source 100 is not limited to three. For example, the RF power source 100 may include two or at least four sources. In addition, the frequency range of RF power generated by a source is not limited to the numerical values given above. For example, at least one source of the RF power source 100 may generate RF power having a frequency of several tens of kHz or less or a frequency of several hundreds of MHz or greater, according to embodiments. In addition, at least one source of the RF power source 100 may generate RF power of several hundreds of W or less or RF power of several thousands of W or greater.

In the plasma processing system 1000, the RF power source 100 may correspond to a power supply that supplies power to the plasma chamber 500. The plasma chamber 500 may act as a load or load circuit, consuming power supplied from the RF power source 100. Accordingly, the plasma chamber 500 is illustrated as load, represented by a capacitor element, in the circuit diagram of FIG. 1B.

In the plasma processing system 1000, the RF power source 100 may include at least two sources and thus generate and supply RF power having various frequencies to the plasma chamber 500. Accordingly, the ion energy and plasma density of the plasma chamber 500 may be independently controlled. For example, in the RF power source 100 including three sources (e.g., the first through third sources 110, 120, and 130), the RF power of the first source 110, which has a high frequency, may generate plasma; and the RF power of the third source 130, which has a low frequency, may generate ions. In addition, RF power of the second source 120, which has an intermediate frequency, may function differently according to embodiments. For example, RF power of the second source 120 may enhance the function of the RF power of the first source 110 and/or the function of the RF power of the third source 130. In addition, RF power may be applied in a pulse form to improve a plasma etch rate and etch profile in the plasma chamber 500.

The matching circuit 200 may control the impedance of the circuit so that a maximum RF power from the RF power source 100 is delivered to the plasma chamber 500. For example, the matching circuit 200 may control impedance to meet a complex conjugate condition based on a maximum power delivery theory, thereby delivering a maximum RF power. In other words, the matching circuit 200 may reduce and/or minimize reflected power such that the RF power source 100 operates in a 50-ohm environment, thereby delivering an improved and/or maximum RF power from the RF power source 100 to the plasma chamber 500.

The matching circuit 200 may include three sub matching circuits (e.g., first through third sub matching circuits 210, 220, and 230) respectively corresponding to frequencies of RF power. For example, the matching circuit 200 may include the first sub matching circuit 210 corresponding to the first frequency F1 MHz of the first source 110, the second sub matching circuit 220 corresponding to the second frequency F2 MHz of the second source 120, and the third sub matching circuit 230 corresponding to the third frequency F3 kHz of the third source 130. Each of the three sub matching circuits (e.g., the first through third sub matching circuits 210, 220, and 230) may control impedance such that a high and/or maximum RF power having a corresponding frequency is delivered.

The plasma control circuit 300 may control and adjust plasma distribution in the plasma chamber 500 by selectively and/or independently controlling harmonics at a very high frequency (VHF) among the frequencies of RF power. For example, the plasma control circuit 300 may control and adjust plasma distribution in the plasma chamber 500 by selectively and/or independently controlling harmonics at the first frequency F1 MHz of the first source 110 that corresponds to a VHF. Here, the plasma distribution may refer to plasma density distribution. The principle and method of controlling plasma distribution in the plasma chamber 500 by controlling harmonics at a VHF will be described in detail with reference to FIGS. 2 through 6.

The plasma control circuit 300 may include a filter circuit 310 and a resonance circuit 330. The filter circuit 310 may perform a filtering function that passes only a certain range of frequency of RF power output from the matching circuit 200. The filter circuit 310 may include, for example, a low pass filter (LPF) 310-1 and/or a high pass filter (HPF) 310-2. The filter circuit 310 may block harmonic components from the matching circuit 200 and allow the resonance circuit 330 to produce resonance for harmonics, which are generated due to the non-linear characteristics of RF power supplied to the plasma chamber 500, and plasma in the plasma chamber 500. At this time, a frequency of the RF power that generates the harmonics via the non-linear characteristic may be, for example, a VHF of at least 40 MHz. Specifically, in the plasma processing system 1000, RF power that has the first frequency F1 MHz and is generated by the first source 110 of the RF power source 100 may be a contributing factor to the generation of harmonics.

The LPF 310-1 may be located at an output terminal of the matching circuit 200 and pass a fundamental wave of frequencies of RF power from the matching circuit 200 while blocking other wave components. For example, the LPF 310-1 may block the harmonic components of frequencies of the RF power. Here, the output terminal of the matching circuit 200 may refer to a portion through which the RF power is output from the matching circuit 200 in a direction in which the RF power is delivered from the RF power source 100 to the plasma chamber 500. Similarly, an input terminal of the matching circuit 200 may refer to a portion, through which the RF power is input to the matching circuit 200. The HPF 310-2 may be located, together with the resonance circuit 330, between the LPF 310-1 and the plasma chamber 500. As described above, most of the harmonic components of frequencies of RF power may be blocked by the LPF 310-1. However, harmonics may be generated due to the non-linear characteristics of RF power and plasma, and there may be harmonics that are not blocked by the LPF 310-1. Such harmonics may cause nonuniform plasma distribution in the plasma chamber 500. Nonuniform plasma distribution caused by harmonics will be described in detail with reference to FIGS. 3 and 4. Therefore, the HPF 310-2 may be located together with the resonance circuit 330 to help the resonance circuit 330 in producing resonance for harmonics, thus reducing and/or minimizing non-uniform plasma distribution.

According to embodiments, at least one selected from the LPF 310-1 and the HPF 310-2 may be omitted from the plasma control circuit 300. For example, each of the three sub matching circuits (e.g., the first through third sub matching circuits 210, 220, and 230) of the matching circuit 200 may include an LPF. In this case, the LPF 310-1 may be omitted from the plasma control circuit 300.

As shown in FIG. 1C, the LPF 310-1 may have a circuit structure in which a first inductor L1 and a first capacitor C1 are connected in parallel. The HPF 310-2 may have a circuit structure in which a second inductor L2 and a second capacitor are connected in parallel. However, the circuit structure of the LPF 310-1 and the HPF 310-2 is not limited to the one shown in FIG. 1C.

The resonance circuit 330 may produce resonance for harmonics. The resonance circuit 330 may include a series resonance circuit and/or a parallel resonance circuit. For example, the resonance circuit 330 may include at least one selected from an inductor-capacitor (LC) series resonance circuit, a resistor-inductor-capacitor (RLC) series resonance circuit, an LC parallel resonance circuit, and an RLC parallel resonance circuit. According to some example embodiments, the resonance circuit 330 may have a series-parallel resonance circuit structure.

The resonance circuit 330 may include a variable element (e.g., a variable capacitor, a variable resistor, and/or a variable inductor). In this case, the resonance circuit 330 may produce resonance for each harmonic by adjusting the variable element. In the circuit diagram of FIG. 1B, the resonance circuit 330 is illustrated as a variable capacitor to emphasize the variable characteristic of the resonance circuit 330. In addition, a circuit structure in which a first variable capacitor Cv1 and a third inductor L3 are connected in series is illustrated in FIG. 1C as a specific example of the resonance circuit 330. However, the circuit structure of the resonance circuit 330 is not limited to the one that is shown in FIG. 1C. The detailed circuit structure of the resonance circuit 330 may vary with all circuit characteristics of the plasma processing system 1000. For example, the resonance circuit 330 may have a circuit structure that produces resonance for harmonics taking into account the impedance characteristics of the matching circuit 200 and the transmission line 400 delivering RF power to the plasma chamber 500, as well as the impedance characteristic of the plasma chamber 500 corresponding to a load. The impedance characteristic of the filter circuit 310 may also be taken into account when the resonance circuit 330 produces resonance. When resonance for a certain frequency is produced, impedance for the certain frequency may be minimized. The variable element may be adjusted by a controller (not illustrated). The controller may include, for example, processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The circuit structure included in the plasma control circuit 300 is not limited to the resonance circuit 330. For example, in a plasma processing system 1000*d*, the plasma control circuit 300 may include a circuit structure, which reduces and/or minimizes the impedance in the plasma chamber 500 and controls the uniformity of plasma distribution, apart from the resonance circuit 330. Hereinafter, embodiments in which the plasma control circuit 300 includes the resonance circuit 330 will be focused on in descriptions below for convenience of description.

The plasma control circuit 300 may not influence the matching circuit 200 and the transmission line 400. For example, in the plasma processing system 1000, the RF power delivery characteristics of the matching circuit 200 and the transmission line 400 may not be influenced by addition of the plasma control circuit 300. If the RF power delivery characteristics of the matching circuit 200 and the transmission line 400 are changed due to addition of the plasma control circuit 300, the matching circuit 200 and the transmission line 400 need to be newly designed to deliver a high and/or maximum RF power.

In the plasma processing system 1000, the plasma control circuit 300 may produce resonance by selectively and/or independently controlling harmonics at a VHF, without influencing the matching circuit 200 and the transmission line 400. Accordingly, the plasma control circuit 300 may effectively control and adjust plasma distribution in the plasma chamber 500, without influencing the RF power delivery characteristics of the plasma processing system 1000.

Meanwhile, the plasma control circuit 300 may be treated as a plasma control apparatus PCA that controls the plasma distribution in the plasma chamber 500. However, though illustrated as comprising separate elements, the plasma processing system 1000 is not so limited. For example, the plasma control apparatus PCA may include the matching circuit 200, the plasma control circuit 300, and the transmission line 400. For example, in another example embodiment, the plasma control apparatus PCA may include the matching circuit 200 and the transmission line 400 as well as the plasma control circuit 300 because the plasma control circuit 300 produces resonance taking into account the impedance of the matching circuit 200 and the transmission line 400 matching circuit. matching circuit The transmission line 400 may be between the matching circuit 200 and the plasma chamber 500 and may deliver RF power to the plasma chamber 500. In the present embodiment, because the plasma control circuit 300 is arranged as the output terminal of the matching circuit 200, it may be seen that the transmission line 400 is between the plasma control circuit 300 and the plasma chamber 500. Although not specifically shown, the transmission line 400 may be arranged between the RF power source 100 and the matching circuit 200.

The transmission line 400 may include, for example, a coaxial cable, a radio frequency (RF) strap, and/or an RF rod. A coaxial cable may include a center conductor, an outer conductor, an insulator, and an outer sheath. A coaxial cable may have a structure in which the center conductor and the outer conductor are arranged in a coaxial form. In general, a coaxial cable has low attenuation at up to high frequency and is, thus, suitable for broadband transmission and may have low leakage due to the outer conductor. Therefore, a coaxial cable may be used for transmission at a high frequency. For example, a coaxial cable may effectively provide RF power having a frequency ranging from several MHz to several tens of MHz, without leakage. There are two types of coaxial cables: one having a characteristic impedance of 50 ohms and the other having a characteristic impedance of 70 ohms.

An RF strap may be, for example, a cable including a strap conductor, a ground housing, and an insulator. The strap conductor may have a strap shape extending in one direction. The ground housing may have a circular tube shape surrounding the strap conductor with a certain distance therebetween. The ground housing may protect the strap conductor from RF radiation. The insulator may fill the space between the strap conductor and the ground housing. The RF rod may have a different structure than an RF strap in the respect that the RF rod includes a rod conductor instead of a strap conductor. For example, the rod conductor of an RF rod may have a cylindrical shape extending in one direction. The RF strap and/or RF rod may provide RF power having a frequency ranging, for example, from several MHz to several tens of MHz.

The impedance characteristic of the transmission line 400 may be changed by changing the physical characteristic of the coaxial cable, the RF strap, and/or the RF rod, in the transmission line 400. For example, when the transmission line 400 includes a coaxial cable, the impedance characteristic of the transmission line 400 may be changed by changing the length of the coaxial cable. When the transmission line 400 includes an RF strap and/or an RF rod, the impedance characteristic of the transmission line 400 may be changed by changing the length of the strap conductor and/or the rod conductor, changing the permittivity and/or permeability of an insulator, and/or changing the size of an inner space of a ground housing.

The plasma chamber 500 may include a chamber body 510, an electrostatic chuck 530, and a shower head 550. The plasma chamber 500 is a chamber for plasma processing, and plasma P may be generated in the plasma chamber 500. The plasma chamber 500 may include a capacitively coupled plasma (CCP) chamber, an inductive coupled plasma (ICP) chamber, or a hybrid CCP-ICP chamber. However, the plasma chamber 500 is not limited to the chambers given above. A plasma processing system may be classified as a CCP mode, an ICP mode, or a CCP-ICP hybrid mode according to the kind of plasma chamber and the kind of RF power applied to the plasma chamber. According to the present embodiment, the plasma processing system 1000 may be of a CCP mode or an ICP mode. The plasma processing system 1000 may be implemented in a CCP-ICP hybrid mode.

The chamber body 510 may define a reaction space, in which plasma is formed, and seal the reaction space from outside the plasma chamber 400. The chamber body 510 may include a metal material and may maintain a ground state to block noise from outside the plasma chamber 400 during plasma processing. For example, the chamber body 510 may include a ground configured to discharge and/or neutralize noise. Although not shown, a gas inlet, a gas outlet, a viewport, and so on may be formed in the chamber body 510. A process gas for plasma processing may be supplied through the gas inlet. Here, the process gas may refer to a gas used for plasma processing. For example, the process gas may refer to a source gas, a reaction gas, and/or a purge gas. After the plasma processing, gases may be discharged from the plasma chamber 500 through the gas outlet. In addition, the inner pressure of the plasma chamber 500 may be adjusted through the gas outlet. At least one viewport may be formed in the chamber body 510, and the interior of the plasma chamber 500 may be monitored through the viewport.

The electrostatic chuck 530 may be located in a lower portion inside the plasma chamber 500. A wafer 2000 (e.g., an object of plasma processing) may be located and fixed on the top of the electrostatic chuck 530. The electrostatic chuck 530 may fix the wafer 2000 via an electrostatic force. The electrostatic chuck 530 may include a bottom electrode for plasma processing. The electrostatic chuck 530 may be connected to the RF power source 100 through the transmission line 400. Accordingly, RF power from the RF power source 100 may be applied into the plasma chamber 500 through the electrostatic chuck 530.

The shower head 550 may be located in an upper portion inside the plasma chamber 500. The shower head 550 may inject process gases, which are supplied through the gas inlet, into the plasma chamber 500 through a plurality of injection holes. The shower head 550 may include a top electrode. The shower head 550 may be connected to, for example, the ground during plasma processing.

Although not shown, the plasma processing system 1000 may include at least one RF sensor. The RF sensor may be located at an output terminal of the RF power source 100 or an input or output terminal of the matching circuit 200 and may measure the RF power delivered to the plasma chamber 500 and/or the impedance of the plasma chamber 500. When the state of the plasma chamber 500 is monitored using the RF sensor, the delivery of RF power to the plasma chamber 500 may be effectively managed and controlled, and accordingly, plasma processing may be precisely performed.

The plasma processing system 1000 includes the plasma control circuit 300 such that resonance is produced for harmonics at a VHF among the frequencies of RF power delivered to the plasma chamber 500, thereby controlling and adjusting the plasma distribution to be uniform in the plasma chamber 500. Accordingly, etching of the wafer 2000 (e.g., an object of plasma processing) may be uniformly performed.

In addition, in the plasma processing system 1000, the plasma control circuit 300 may produce resonance by selectively and/or independently controlling harmonics at a VHF, without influencing the matching circuit 200 and the transmission line 400. Accordingly, the plasma control circuit 300 may effectively control and/or adjust plasma distribution in the plasma chamber 500, without influencing RF power delivery characteristics.

Although the description above has focused on etching, the plasma processing system 1000 may be equipment for vapor deposition, cleaning, and/or other processes that may benefit from an even deposition of charged particles. Accordingly, the plasma processing system 1000 may, for example, uniformly perform vapor deposition and/or cleaning on the wafer 2000. It is apparent that the plasma processing system 1000 may be used for vapor deposition and/or cleaning as well as etching although not specifically mentioned below.

Figure 2:
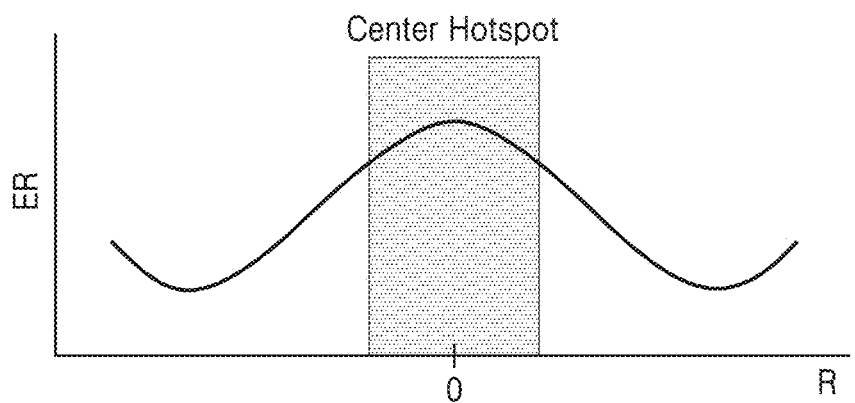
FIG. 2 is a graph showing an etch rate of a wafer in a plasma chamber.

FIG. 2 is a graph showing an etch rate of a wafer in a plasma chamber, where the x-axis indicates a radius R of the wafer and the y-axis indicates an etch rate ER.

Referring to FIG. 2, in general plasma processing, the etch rate ER may be high at the central portion of the wafer and decrease toward the edge of the wafer. Such a phenomenon in which an etch rate increases toward the central portion of a wafer is called a center hotspot, which is shaded in the graph.

The center hotspot may worsen as RF power increases. In addition, punching, not open (NOP), a crater, and/or clogging may occur due to the center hotspot. Here, punching or NOP may refer to a problem in that a membrane has an unintended hole or a hole is not open during plasma etching (respectively), and a crater or clogging may refer to a problem in that a surface rises up or a hole is closed (respectively) due to process gas control for improvement of a center hotspot.

Figure 4:
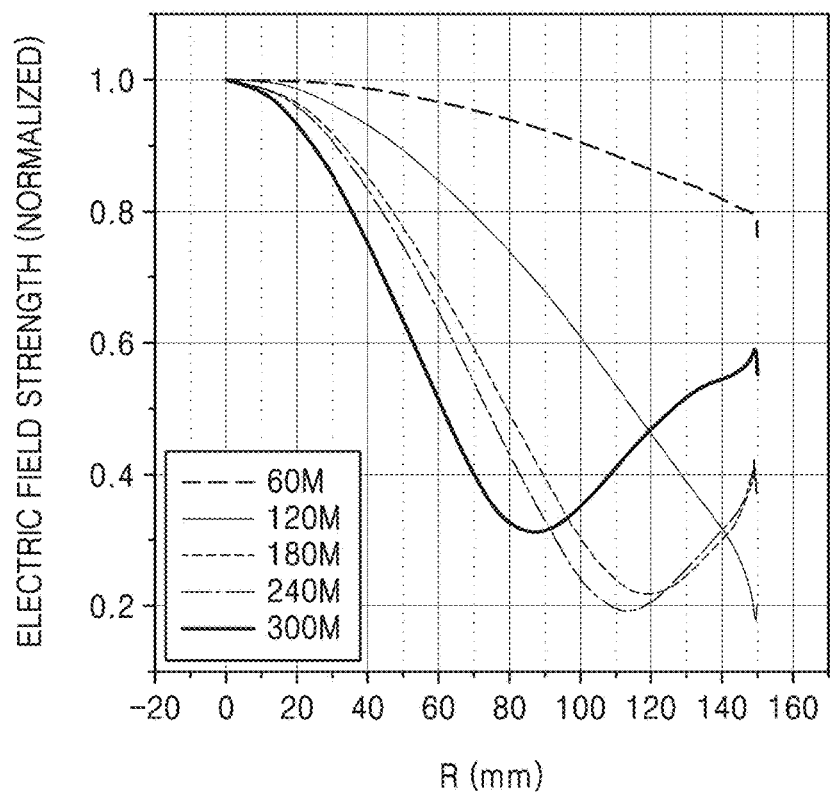
FIG. 4 is a graph showing the influence of harmonics at a VHF among the frequencies of RF power on plasma distribution in a plasma chamber.

Specific causes of the center hotspot are not clear. However, as shown in FIG. 4, harmonic components of a VHF may increase plasma density at the center of the wafer 2000. Accordingly, it may be predicted that the increased plasma density causes an etch rate to increase at the center of the wafer 2000.

In the case of existing plasma processing systems, the center hotspot is mitigated by controlling the amount of process gas according to positions in a plasma chamber and/or changing the shape of a top electrode. However, the methods for controlling the amount of process gas may cause a control problem and may cause a crater and/or clogging problem described above. The method of changing the shape of the top electrode involves the inconvenience of changing the shape every time the process conditions are changed. In addition, a change may occur over time with respect to etching of a top electrode, which cannot be compensated for nor predicted.

Figure 3:
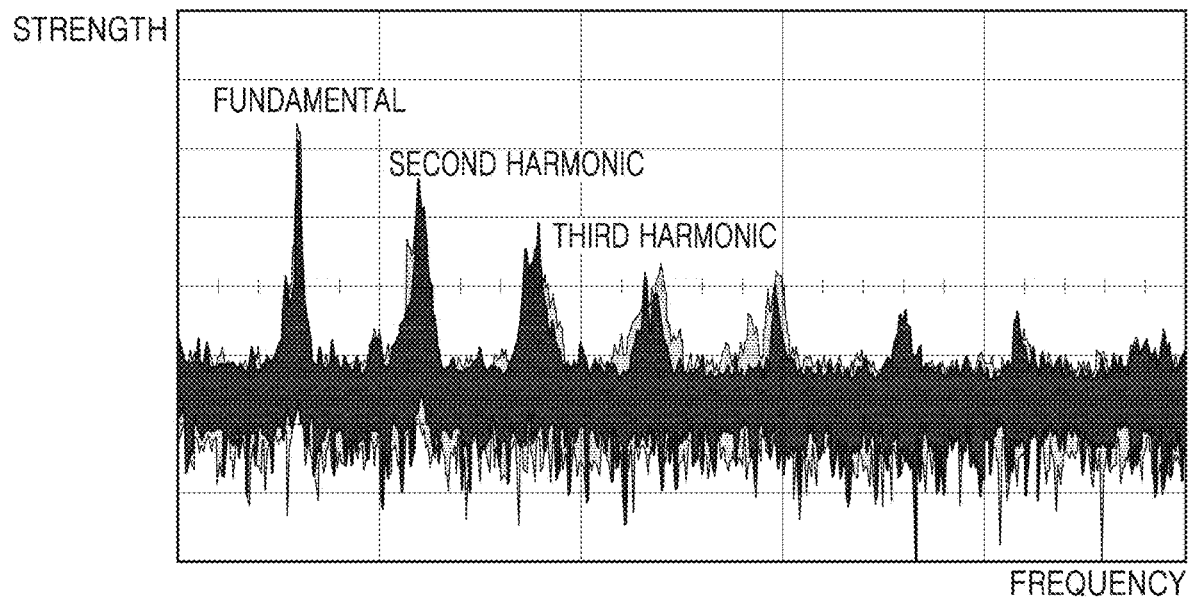
FIG. 3 is a graph showing fundamental and harmonic components of a very high frequency (VHF) among the frequencies of radio frequency (RF) power in a transmission line.

FIG. 3 is a graph showing fundamental and harmonic components of a VHF among the frequencies of RF power in a transmission line, where the x-axis indicates a frequency of the VHF and the y-axis indicates a strength of the VHF.

Referring to FIG. 3, generally, when RF power is applied to the plasma chamber 500, harmonic components of the frequencies of the RF power are blocked by the LPF 310-1, and therefore, only a fundamental wave may be transmitted to the plasma chamber 500 through the transmission line 400. However, some harmonics may not be completely blocked by the LPF 310-1 and may be transmitted to the plasma chamber 500, or harmonics at the VHF may be generated due to the non-linear characteristics of VHF RF power and plasma, as described above. Such harmonics may cause nonuniform plasma distribution in the plasma chamber 500.

The graph of FIG. 3 shows VHF harmonics detected in the transmission line 400, for example, implemented as an RF load. In the graph, peaks may correspond to a fundamental, a second harmonic, and a third harmonic, respectively, at the VHF. The fundamental may correspond to a first harmonic.

FIG. 4 is a graph showing the influence of harmonics at a VHF among the frequencies of RF power on plasma distribution in a plasma chamber, where the x-axis indicates a distance in a radial direction of a wafer in the plasma chamber and the y-axis indicates a normalized electric field strength.

Referring to FIG. 4, the graph shows electric field strengths according to positions in the plasma chamber with respect to second through fifth harmonics, with a VHF of 60 MHz as a fundamental. It may be seen that the electric field strengths of the harmonics are much higher in a central portion than in an edge portion as compared to the fundamental. For example, in the case of the fundamental, when an electric field strength at the central portion is normalized as 1, an electric field strength at the edge portion appears to be about 0.8. In the case of the third or fourth harmonic, when an electric field strength at the central portion is normalized as 1, an electric field strength at the edge portion appears to be about 0.3.

Based on such distribution of electric field strengths, there is not a great difference in the electric field strength between the central portion and the edge portion in the case of the fundamental frequency, and therefore, there may be not a great difference in the density of plasma generated by the fundamental between the central portion and the edge portion. Accordingly, plasma distribution may be more or less uniform in the plasma chamber. Contrarily, in the case of the harmonics, there is a great difference in an electric field strength between the central portion and the edge portion, and therefore, there may be a greater difference in the density of plasma generated by the harmonics between the central portion and the edge portion. Accordingly, plasma distribution may be nonuniform in the plasma chamber. Consequently, based on the results shown in the graph of FIG. 4, it may be predicted that the center hotspot described with reference to FIG. 2 will be caused by VHF harmonics.

Figure 5A:
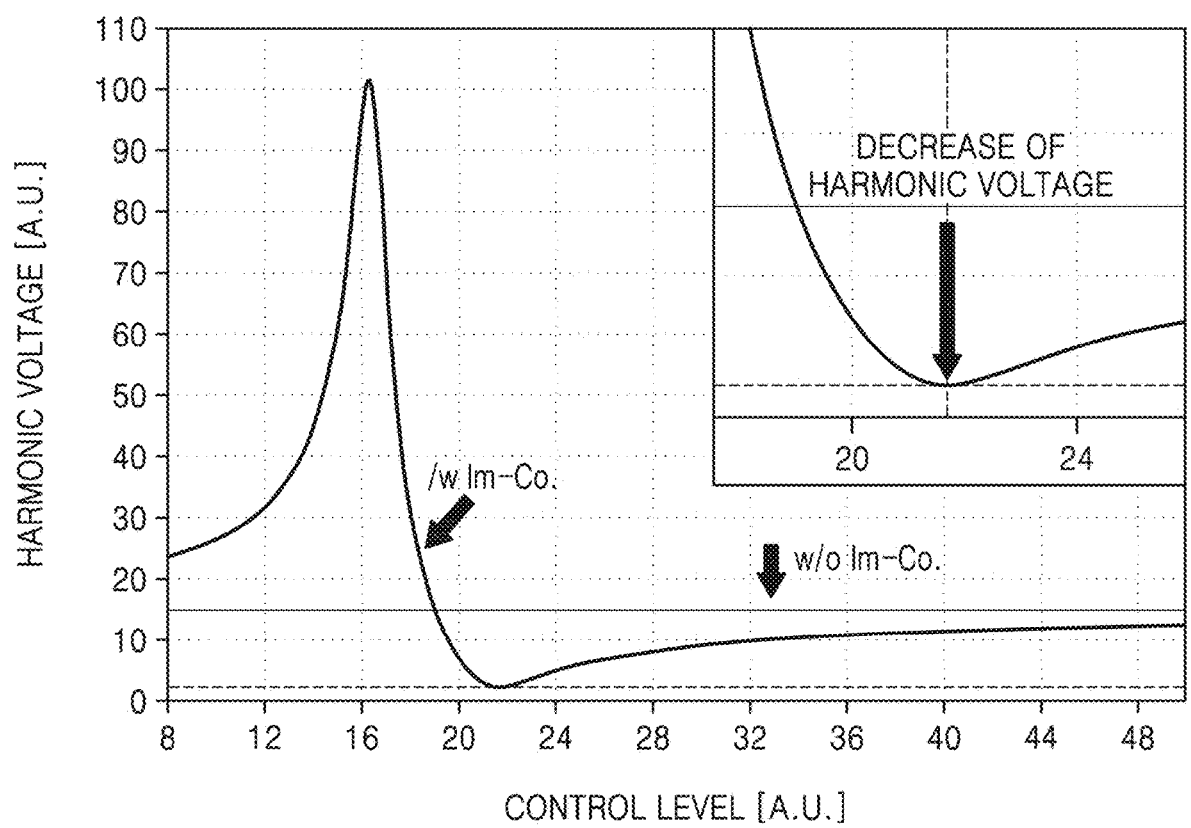
FIGS. 5A and 5B are graphs showing a change in a harmonic voltage and a change in an etch rate with respect to impedance control of a plasma control circuit.
Figure 5B:
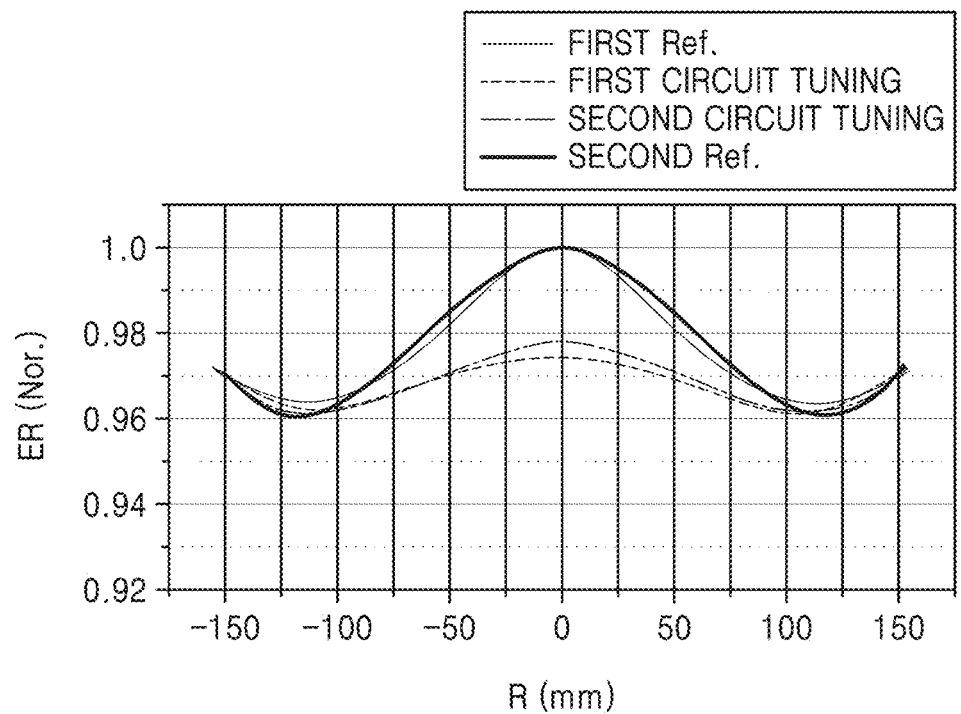

FIGS. 5A and 5B are graphs showing a change in a harmonic voltage and a change in an etch rate with respect to impedance control of a plasma control circuit. In FIG. 5A, the x-axis indicates an impedance control level of the plasma control circuit and the y-axis indicates a harmonic voltage or power. In FIG. 5B, the x-axis indicates the radius R of a wafer and the y-axis indicates the etch rate ER. Here, [A.U.] may be a unit referring to a relative size.

Referring to FIG. 5A, when there is no impedance control by the plasma control circuit 300 (e.g., without Im-Co.), a harmonic may be more or less maintained at a certain voltage and/or power. When impedance control is performed by the plasma control circuit 300 (e.g., with Im-Co.), a harmonic voltage may be significantly changed. As shown in the enlarged portion on the upper right side of the graph, the harmonic voltage may be decreased by impedance control and maintained to be lower than that when there is no impedance control.

The impedance control by the plasma control circuit 300 may refer to producing resonance for a harmonic using the plasma control circuit 300. For example, impedance for a harmonic may be minimized and/or changed by producing the resonance for the harmonic using the plasma control circuit 300. Accordingly, a method of producing resonance for a harmonic using the plasma control circuit 300 may correspond to the impedance control.

Referring to FIG. 5B, "FIRST Ref." may refer to a measurement result before impedance control by the plasma control circuit 300, "FIRST CIRCUIT TUNING" and "SECOND CIRCUIT TUNING" may refer to two measurement results after the impedance control by the plasma control circuit 300, and "SECOND Ref." may refer to a measurement result after the state is returned to that before the impedance control.

In the graph, the etch rate ER is normalized such that a maximum value is 1 and is relatively represented at the central and edge portions of the wafer 2000. Differences in the etch rate ER between the edge and central portions of the wafer 2000 in "FIRST Ref." and "SECOND Ref." are greater than those in "FIRST CIRCUIT TUNING" and "SECOND CIRCUIT TUNING".

In detail, it may be seen that a difference in the etch rate ER between the central and edge portions of the wafer 2000 is about 0.04 before the impedance control but is decreased to about 0.02 after the impedance control. Consequently, the difference in an etch rate between the central and edge portions of the wafer 2000 may be decreased through impedance control by the plasma control circuit 300, and therefore, the etch rate may become more or less uniform throughout the wafer 2000.

The difference in an etch rate between the central and edge portions of the wafer 2000 may correspond to a difference in plasma density between a central portion and an edge portion in the plasma chamber 500. Accordingly, the difference in plasma density between the central portion and the edge portion in the plasma chamber 500 may be decreased through the impedance control by the plasma control circuit 300. As a result, plasma distribution may become more or less uniform in the plasma chamber 500.

Figure 6:
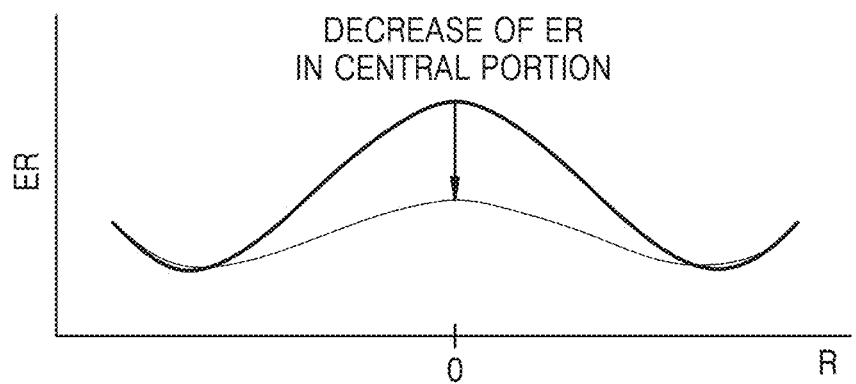
FIG. 6 is a graph showing a change in an etch rate in a central portion of a plasma chamber in the plasma processing system of FIG. 1A.

FIG. 6 is a graph showing a change in an etch rate in a central portion of a plasma chamber in the plasma processing system 1000 of FIG. 1A, where the x-axis indicates the radius R of a wafer and the y-axis indicates the etch rate ER. For convenience of description, FIG. 1A is also referred to.

Referring to FIG. 6, the bold line represents the etch rate ER when there is not impedance control by the plasma control circuit 300 and is substantially the same as the graph of FIG. 2, and the thin line represents the etch rate ER when there is impedance control by the plasma control circuit 300. As seen from the graph, the etch rate ER at the central portion of the wafer 2000 may be significantly decreased through the impedance control by the plasma control circuit 300. Accordingly, the plasma processing system 1000 may effectively alleviate or eliminate a center hotspot, which occurs when there is no impedance control, by performing impedance control using the plasma control circuit 300.

Figure 7:
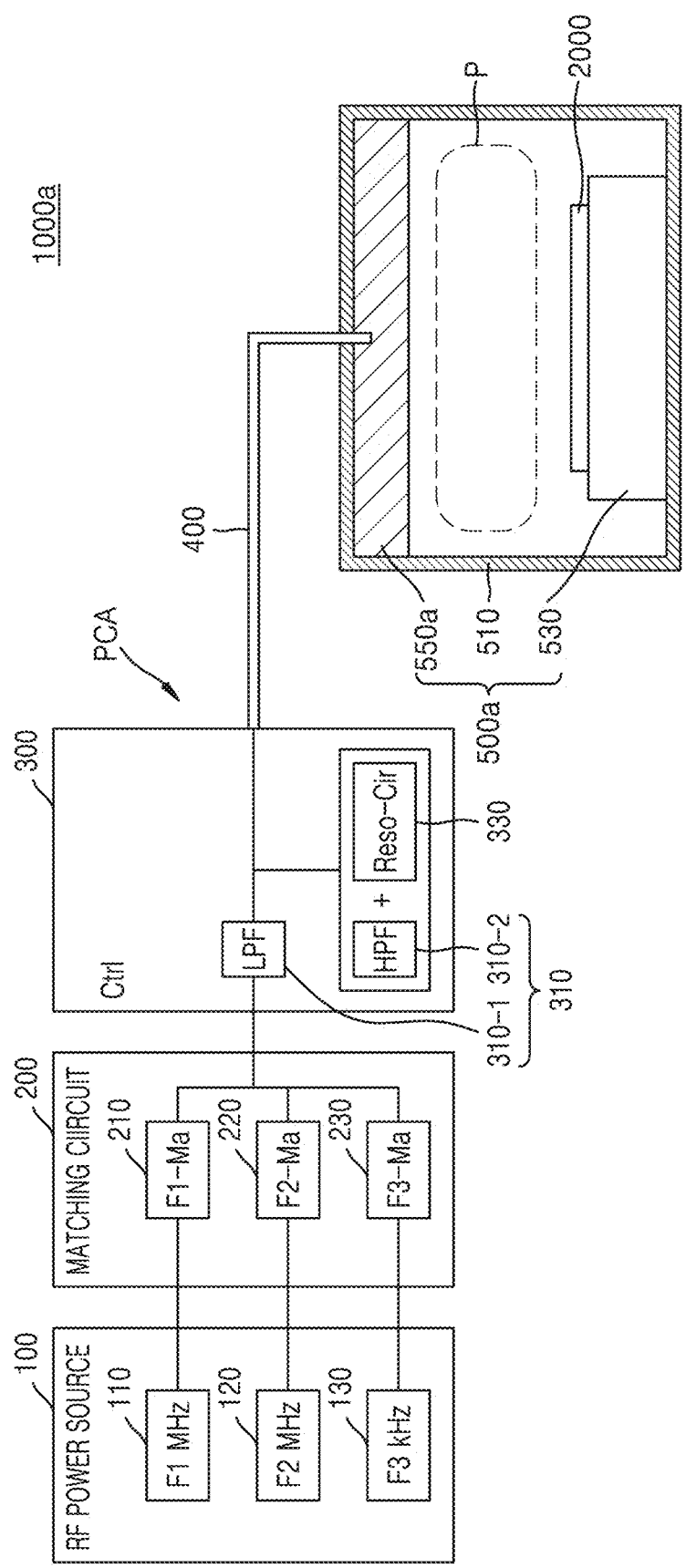
FIGS. 7 through 9 are block diagrams and a circuit diagram of plasma processing systems according to example embodiments.
Figure 8:
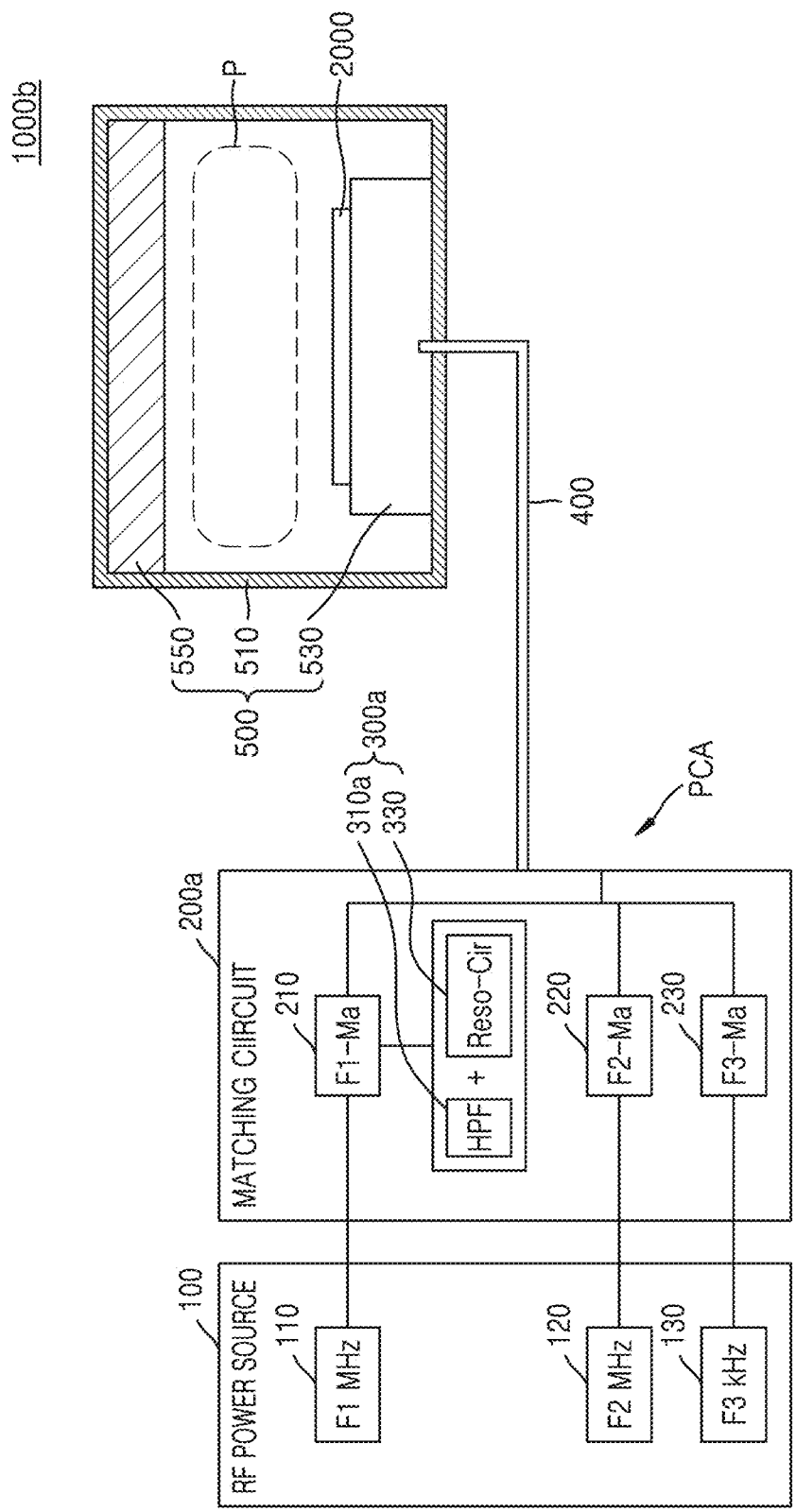
Figure 9:
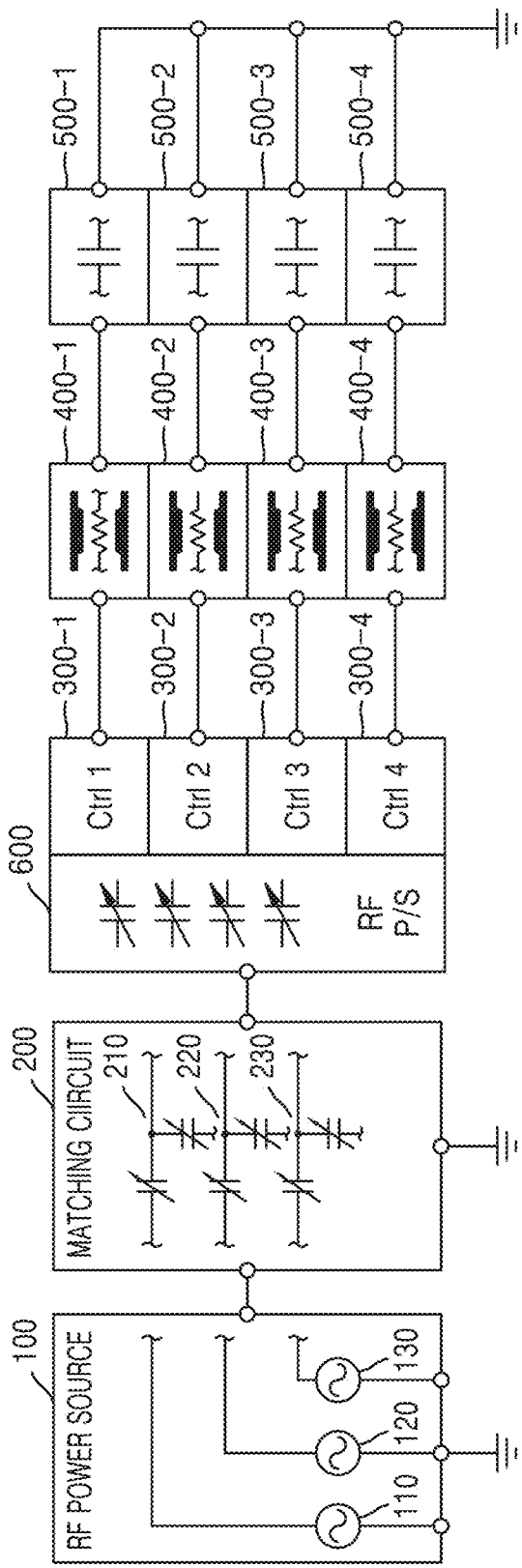

FIGS. 7 through 9 are block diagrams and a circuit diagram of plasma processing systems according to example embodiments. FIGS. 7 and 8 may correspond to the block diagram of FIG. 1A, and FIG. 9 may correspond to the circuit diagram of FIG. 1B. Redundant descriptions already given with reference to FIGS. 1A through 6 will be brief or omitted.

Referring to FIG. 7, a plasma processing system 1000a may be different from the plasma processing system 1000 of FIG. 1A in that the plasma processing system 1000a has a structure in which RF power is applied to a plasma chamber 500a through a shower head 550a. For example, in the plasma processing system 1000a, the shower head 550a of the plasma chamber 500a may include a top electrode, and the plasma control circuit 300 may be connected to the shower head 550a through the transmission line 400. Accordingly, RF power from the RF power source 100 may be applied to the plasma chamber 500a via the matching circuit 200, the plasma control circuit 300, the transmission line 400, and the shower head 550a. At this time, the electrostatic chuck 530 including a bottom electrode may be connected to the ground.

According to an example embodiment, the plasma processing system may have a structure in which RF power is applied to both the electrostatic chuck 530 and the shower head 550a. In this structure, the RF power source 100, the matching circuit 200, and the plasma control circuit 300 may be connected to each of the electrostatic chuck 530 and the shower head 550a. When plasma processing is performed by the plasma processing system having this structure, RF power may be applied to either the electrostatic chuck 530 or the shower head 550a. Alternatively, RF power may be applied alternately to the electrostatic chuck 530 and the shower head 550a.

Referring to FIG. 8, a plasma processing system 1000b may be different from the plasma processing system 1000 of FIG. 1A in that a plasma control circuit 300a is located in a matching circuit 200a. In detail, in the plasma processing system 1000b, the plasma control circuit 300a may include a filter circuit 310a and the resonance circuit 330 and may be connected to an output terminal of the first sub matching circuit 210 of the matching circuit 200a.

As described above, the first sub matching circuit 210 may control impedance for the first frequency F1 MHz from the first source 110 of the RF power source 100. The first frequency F1 MHz from the first source 110 may correspond to a VHF. Accordingly, to produce resonance for harmonics at the VHF, the plasma control circuit 300a may be connected to the first sub matching circuit 210.

When the plasma control circuit 300a is implemented in the matching circuit 200a in the plasma processing system 1000b, the plasma control circuit 300a does not need to be separately manufactured and assembled, thereby facilitating compactness of the plasma processing system 1000b. Because the resonance circuit 330 considers only the impedance of the first sub matching circuit 210 and the transmission line 400, the plasma control circuit 300a may have the resonance circuit 330 with a simple configuration.

The plasma control apparatus PCA may include only the plasma control circuit 300a. The plasma control apparatus PCA may also include the matching circuit 200a, the plasma control circuit 300a, and the transmission line 400.

Referring to FIG. 9, a plasma processing system 1000c may be different from the plasma processing system 1000 of FIG. 1A in that the plasma processing system 1000c further includes an RF power splitter 600 and includes four plasma control circuits 300-1 through 300-4, and four plasma chambers 500-1 through 500-4. The RF power splitter 600, which splits RF power from the RF power source 100 into pieces of partial RF power, may be located at the output terminal of the matching circuit 200. For example, the RF power splitter 600 may split RF power into four pieces of partial RF power. Corresponding to four pieces of partial RF power from the RF power splitter 600, the four plasma control circuits 300-1 through 300-4 and the four plasma chambers 500-1 through 500-4 may be provided. In the plasma processing system 1000c, four transmission lines 400-1 through 400-4 may be provided to respectively connect the four plasma control circuits 300-1 through 300-4 to the four plasma chambers 500-1 through 500-4.

Although RF power is split into four pieces of partial RF power by the RF power splitter 600 in the plasma processing system 1000c, the number of pieces of partial RF power is not limited to four. For example, the RF power splitter 600 may split RF power into two, three, or at least five pieces of partial RF power. In addition, as many plasma control circuits 300 and as many plasma chambers 500 as the number of pieces of partial RF power may be provided.

For mass production, the plasma processing system 1000c may have a structure for splitting and supplying RF power from one RF power source 100 to the four plasma chambers 500-1 through 500-4 using the RF power splitter 600. In a system having such a splitting structure, a balanced division of RF power and uniform plasma distribution in each of the four plasma chambers 500-1 through 500-4 may be important in plasma processing. Accordingly, respectively corresponding to the four plasma chambers 500-1 through 500-4, the four plasma control circuits 300-1 through 300-4 may be provided at an output terminal of the RF power splitter 600.

Each of the four plasma control circuits 300-1 through 300-4 may produce resonance for harmonics at a VHF among the frequencies of RF power applied to a corresponding one of the four plasma chambers 500-1 through 500-4. Therefore, each of the four plasma control circuits 300-1 through 300-4 may control and adjust plasma distribution to be uniform in the corresponding one of the four plasma chambers 500-1 through 500-4. Each of the four plasma control circuits 300-1 through 300-4 may produce resonance for VHF harmonics, taking into account the impedance of each of the matching circuit 200, the RF power splitter 600, and a corresponding one of the four transmission lines 400-1 through 400-4, and may not influence the matching circuit 200, the RF power splitter 600, and the corresponding one of the four transmission lines 400-1 through 400-4.

When the four transmission lines 400-1 through 400-4 and the four plasma chambers 500-1 through 500-4 respectively corresponding to the four transmission lines 400-1 through 400-4 have substantially the same impedance characteristic, one plasma control circuit may be provided between the matching circuit 200 and the RF power splitter 600. In other words, plasma distribution in the four plasma chambers 500-1 through 500-4 may be simultaneously controlled and adjusted using one plasma control circuit.

Figure 10:
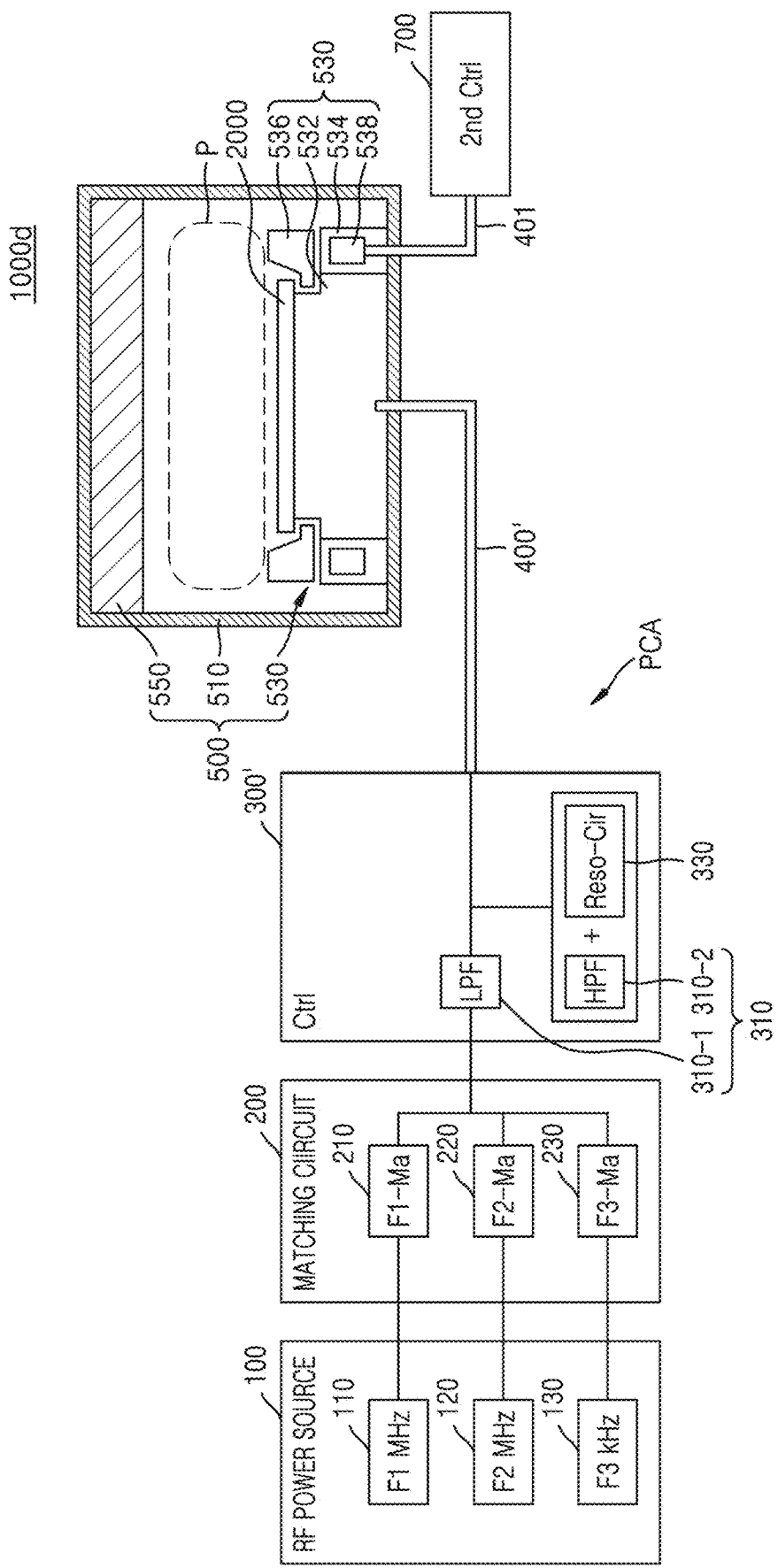
FIG. 10 is a block diagram of a plasma processing system according to an example embodiment.

FIG. 10 is a block diagram of a plasma processing system 1000d according to an embodiment.

Referring to FIG. 10, the plasma processing system 1000d may be different from the plasma processing system 1000 of FIG. 1A and the plasma processing systems 1000a through 1000c of FIGS. 7 through 8 in that the plasma processing system 1000d further includes a second plasma control circuit 700. In detail, the plasma processing system 1000d may include the RF power source 100, the matching circuit 200, the first plasma control circuit 300', the first transmission line 400', the plasma chamber 500, and the second plasma control circuit 700.

The first plasma control circuit 300' may be substantially the same as the first plasma control circuit 300 of the plasma processing system 1000 of FIG. 1A. However, the first plasma control circuit 300' is not limited thereto. For example, the plasma processing system 1000d may include, as the first plasma control circuit 300', the plasma control circuit 300a in FIG. 8 or the plasma control circuits 300-1 through 300-4 in FIG. 9.

Descriptions of the RF power source 100, the matching circuit 200, the first transmission line 400', and the plasma chamber 500 are the same as those of the RF power source 100, the matching circuit 200, the transmission line 400, and the plasma chamber 500 of the plasma processing system 1000 of FIG. 1A. The connection structure of the first transmission line 400' and the plasma chamber 500 is not limited to that of the plasma processing system 1000 of FIG. 1A and may adopt the connection structure of the plasma processing system 1000a of FIG. 7 or the plasma processing system 1000c of FIG. 9. When the plasma processing system 1000d adopts the connection structure of the plasma processing system 1000c of FIG. 9, the plasma processing system 1000d may include an RF power splitter, four plasma chambers, four first plasma control circuits, and four first transmission lines and may also include four second plasma control circuits. The numbers of pieces of partial RF power from an RF power splitter, first plasma control circuits, second plasma control circuits, and first transmission lines may vary with the number of plasma chambers.

The plasma processing system 1000d may include the second plasma control circuit 700 connected to a conductive ring 538 of the electrostatic chuck 530. Before the second plasma control circuit 700 is described, the structure of the electrostatic chuck 530 of the plasma chamber 500 will be described in detail with reference to FIG. 10.

The electrostatic chuck 530 may include an electrode portion 532, an insulating isolation 534, an edge ring 536, and the conductive ring 538. The electrode portion 532 may be located in a lower central portion of the plasma chamber 500 and may include therein a power applying electrode for chucking/dechucking and plasma processing of the wafer 2000. The wafer 2000 that is an object of plasma processing may be located on the top of the electrode portion 532 and fixed by an electrostatic force.

The insulating isolation 534 may have a structure surrounding the electrode portion 532 and include an insulator such as alumina. However, the material of the insulating isolation 534 is not limited thereto.

The edge ring 536 may be arranged at an outer edge of the electrode portion 532 to surround the wafer 2000. The edge ring 536 may include silicon and extend a silicon area of the wafer 2000, thereby preventing plasma from being concentrated in the edge portion of the wafer 2000. The edge ring 536 may include a single ring type, which is usually referred to as a focus ring, or double ring type, which is usually referred to as a combo-ring.

The conductive ring 538 may be arranged in the insulating isolation 534 to surround the electrode portion 532. The conductive ring 538 may include a metal such as aluminum. However, the material of the conductive ring 538 is not limited thereto. The conductive ring 538 may be electrically coupled to the edge ring 536 and may contribute to the plasma distribution control of the edge ring 536.

The structure of the electrostatic chuck 530 of the plasma chamber 500 in the plasma processing systems 1000, 1000a, and 1000b of FIGS. 1A, 7, and 8 is substantially the same as that of the electrostatic chuck 530 in the plasma processing system 1000d of the present embodiment but is simply illustrated because a second plasma control circuit is not included in the plasma processing systems 1000, 1000a, and 1000b of FIGS. 1A, 7, and 8.

In the plasma processing system 1000d, the second plasma control circuit 700 may be connected to the conductive ring 538. The second plasma control circuit 700 may be connected to the conductive ring 538 through, for example, a second transmission line 401. The second plasma control circuit 700 may contribute to plasma distribution control in the plasma chamber 500 by controlling the characteristic impedance of an edge region (refer to ER-P3 in FIGS. 11A and 11B) adjacent to the edge ring 536. For example, due to the edge ring 536 and the conductive ring 538 in the edge region ER-P3, control of VHF harmonics by the first plasma control circuit 300 may be limited. When the plasma processing system 1000*d* includes the second plasma control circuit 700, the limitation may be overcome, and therefore, plasma distribution in the plasma chamber 500 may be effectively controlled by the first plasma control circuit 300'.

The second plasma control circuit 700 may include a certain circuit structure to contribute to impedance control for harmonic components. For example, similarly to the first plasma control circuit 300', the second plasma control circuit 700 may include a filter circuit (710 in FIG. 12A) and a resonance circuit (720 in FIG. 12A) and contribute to impedance control for VHF harmonics. The structure of the second plasma control circuit 700 will be described in detail with reference to FIGS. 12A and 12B.

The plasma processing system 1000*d* further includes the second plasma control circuit 700 connected to the conductive ring 538 in the edge region ER-P3, thereby preventing control limitation occurring due to the edge ring 536 and the conductive ring 538 in the edge region ER-P3 and more effectively controlling plasma distribution by the first plasma control circuit 300 in the plasma chamber 500.

Figure 11A:
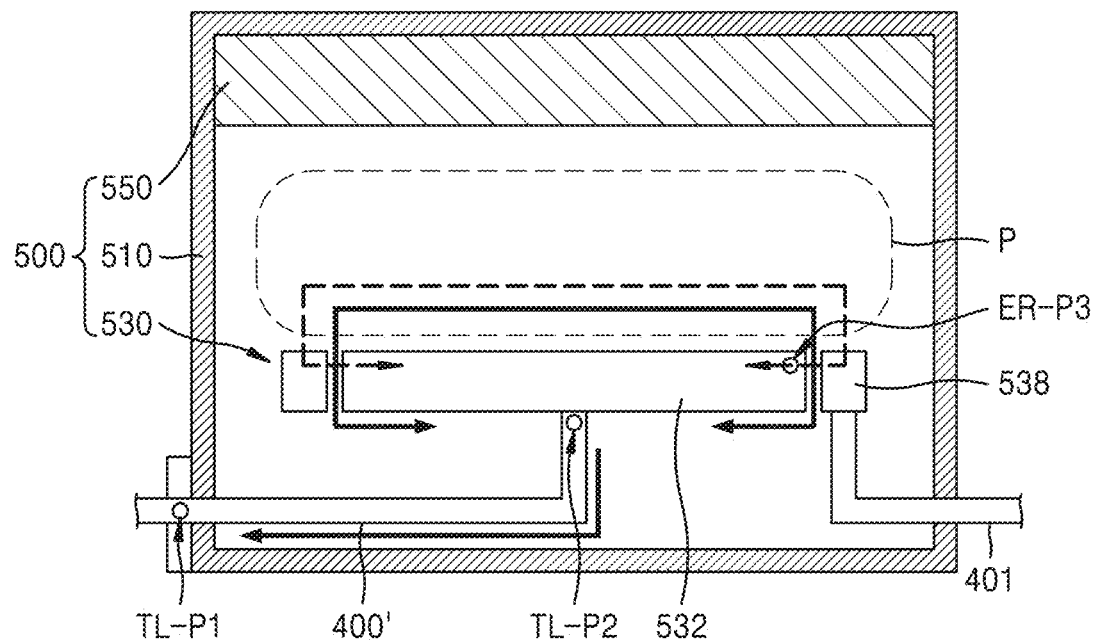
FIG. 11A is a conceptual diagram showing the traveling direction of a harmonic component of a VHF in the plasma processing system of FIG. 10.

FIG. 11A is a conceptual diagram showing the traveling direction of a harmonic component of a VHF in the plasma processing system 1000*d* of FIG. 10. For clarity, only the electrode portion 532 and the conductive ring 538 of the electrostatic chuck 530 are schematically illustrated in FIG. 11A, and only a portion of the first transmission line 400' from the chamber body 510 to the electrode portion 532 at which an electrode is actually located in the electrostatic chuck 530 is shown in FIG. 11A.

Referring to FIG. 11A, in general, harmonic components, which are generated via the non-linear characteristics of plasma in the plasma chamber 500 and RF power supplied to the plasma chamber 500, may be delivered from the inside of the plasma chamber 500 to the outside thereof through the first transmission line 400', as shown by a solid line arrow. However, due to the edge ring 536 and the conductive ring 538 in the edge region ER-P3, harmonic components may be reflected from the conductive ring 538 in the edge region ER-P3, or the like, and may form a path shown by a dashed line arrow. The reflected harmonic components may not be delivered outside the plasma chamber 500 through the first transmission line 400 but may remain in the plasma chamber 500, for example, in a sine wave form. There may be a limit to controlling such harmonic components, which remain in the plasma chamber 500 due to the reflection, using the first plasma control circuit 300.

Figure 11B:
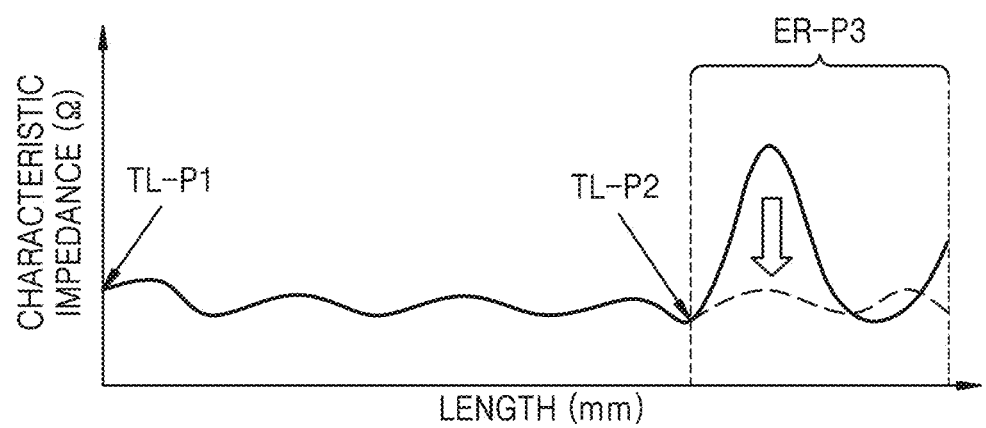
FIG. 11B is a graph showing characteristic impedance of a first transmission line in a plasma chamber with respect to the traveling direction of the harmonic component of the VHF in FIG. 11A.

FIG. 11B is a graph showing characteristic impedance of the first transmission line 400' in the plasma chamber 500 with respect to the traveling direction of the harmonic component of the VHF in FIG. 11A, where the x-axis indicates a position in the first transmission line 400' in a direction, in which the first transmission line 400' extends from an input terminal of the plasma chamber 500 to the inside of the plasma chamber 500, and the y-axis indicates characteristic impedance at each position in the first transmission line 400'. In the graph of FIG. 11B, the edge region ER-P3 is treated as a portion of the first transmission line 400'.

Referring to FIG. 11B, it may be seen that the characteristic impedance of the first transmission line 400' from an input terminal TL-P1 to a connection portion TL-P2 is more or less constant. Here, the input terminal TL-P1 may refer to a portion at which the first transmission line 400' is connected to the chamber body 510 of the plasma chamber 500, and the connection portion TL-P2 may refer to a portion at which the first transmission line 400' is connected to the electrode portion 532. The connection portion TL-P2 may include the central portion of the electrode portion 532 in a broad interpretation.

It may also be seen in FIG. 11B that the characteristic impedance of the first transmission line 400' significantly changes in the edge region ER-P3 in which the edge ring 536 and the conductive ring 538 are located. In general, when the characteristic impedance of the first transmission line 400' is more or less constant in the plasma chamber 500, it may be easy to control impedance of the plasma chamber 500 using the first plasma control circuit 300 and thus to control plasma distribution. Therefore, it may be desired to adjust the characteristic impedance of the first transmission line 400' in the edge region ER-P3 to the characteristic impedance of another portion, e.g., the first transmission line 400' from the input terminal TL-P1 to the connection portion TL-P2.

In the plasma processing system 1000*d*, the second plasma control circuit 700 connected to the conductive ring 538 may perform such a function. In other words, the second plasma control circuit 700 may perform a function of adjusting the characteristic impedance of the edge region ER-P3 to the characteristic impedance of the first transmission line 400' from the input terminal TL-P1 to the connection portion TL-P2.

In the graph of FIG. 11B, the solid line curve represents characteristic impedance when there is no control by the second plasma control circuit 700 and the dashed line curve in the edge region ER-P3 represents a state where the characteristic impedance has been adjusted to that of other portions of the first transmission line 400' by the second plasma control circuit 700.

FIGS. 12A through 12D are detailed block diagrams of the second plasma control circuit 700 and detailed circuit diagrams of the second plasma control circuit 700 and an edge control circuit 800, in the plasma processing system 1000*d* of FIG. 10.

Figure 12A:
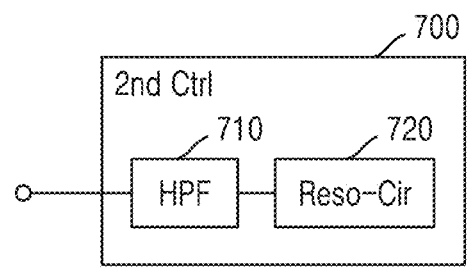
FIGS. 12A through 12D are detailed block diagrams of a second plasma control circuit and detailed circuit diagrams of the second plasma control circuit and an edge control circuit, in the plasma processing system of FIG. 10.

Referring to FIG. 12A, the second plasma control circuit 700 of the plasma processing system 1000*d* may include a filter circuit 710 and a resonance circuit 720. The filter circuit 710 may include, for example, an HPF, and may pass only harmonic component of a VHF. In other words, harmonic components of a VHF generated in the plasma chamber 500 may be transmitted to the second plasma control circuit 700 through the second transmission line 401, may undergo filtering of the filter circuit 710, and may then be transmitted to the resonance circuit 720. As shown in FIG. 12C, the filter circuit 710 may have a circuit structure in which a fourth inductor L4 and a fifth inductor L5 respectively at both sides of a third capacitor C3 are connected in parallel. However, the circuit structure of the filter circuit 710 is not limited to that shown in FIG. 12C.

The resonance circuit 720 may produce resonance for harmonics. The resonance circuit 720 may include a series resonance circuit and/or a parallel resonance circuit. For example, the resonance circuit 720 may include at least one selected from an LC series resonance circuit, an RLC series resonance circuit, an LC parallel resonance circuit, and an RLC parallel resonance circuit. According to embodiments, the resonance circuit 720 may have a series-parallel resonance circuit structure.

As shown in FIG. 12C, the resonance circuit 720 may include a fourth capacitor C4, a fifth capacitor C5, a sixth inductor L6, and a second variable capacitor Cv2. In the resonance circuit 720, the sixth inductor L6 and the second variable capacitor Cv2 may be connected in series to each other and may be connected in parallel between the fourth capacitor C4 and the fifth capacitor C5. However, the circuit structure of the resonance circuit 720 is not limited to that shown in FIG. 12C.

In the plasma processing system 1000d, the detailed circuit structure of the resonance circuit 720 may vary with characteristic impedance appearing in the edge region ER-P3. For example, as described above, the resonance circuit 720 may have a circuit structure that allows the characteristic impedance of the edge region ER-P3 to be similar to that of the other portion of the first transmission line 400'.

In the plasma processing system 1000d, a circuit structure included in the second plasma control circuit 700 is not limited to the resonance circuit 720. For example, the second plasma control circuit 700 may include a circuit structure, which may adjust the characteristic impedance of the edge region ER-P3 to a required level, apart from the resonance circuit 720.

Figure 12B:
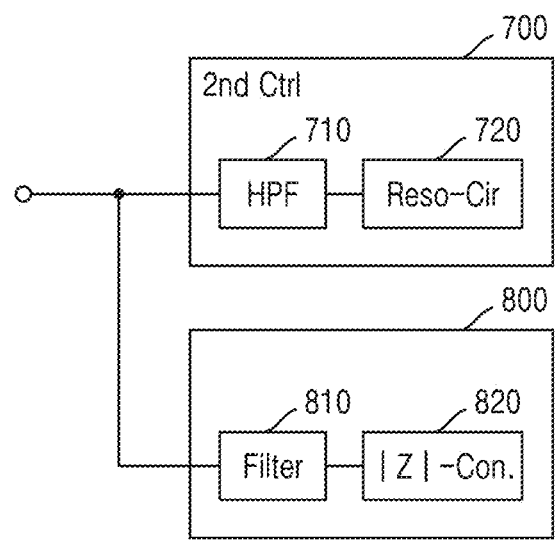
Figure 12C:
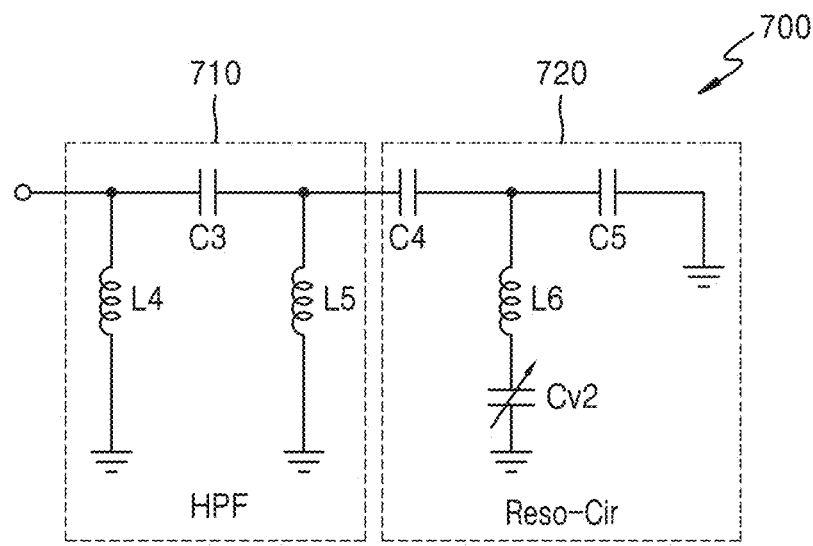

Referring to FIG. 12B, the second plasma control circuit 700 of the plasma processing system 1000d may be connected in parallel to the edge control circuit 800, which controls the impedance of the edge region ER-P3, and thus connected to the conductive ring 538. For example, the edge control circuit 800 may include a filter circuit 810 and an impedance control circuit 820. The filter circuit 810 may block at least some of frequencies, which are transmitted to the plasma chamber 500 through the first transmission line 400', and pass only a certain frequency. The impedance control circuit 820 may adjust the impedance of the edge region ER-P3 by controlling the certain frequency passing through the filter circuit 810. The edge control circuit 800 may be functionally different from the second plasma control circuit 700 in that the edge control circuit 800 controls not harmonic components but a frequency from the RF power source 100.

Figure 12D:
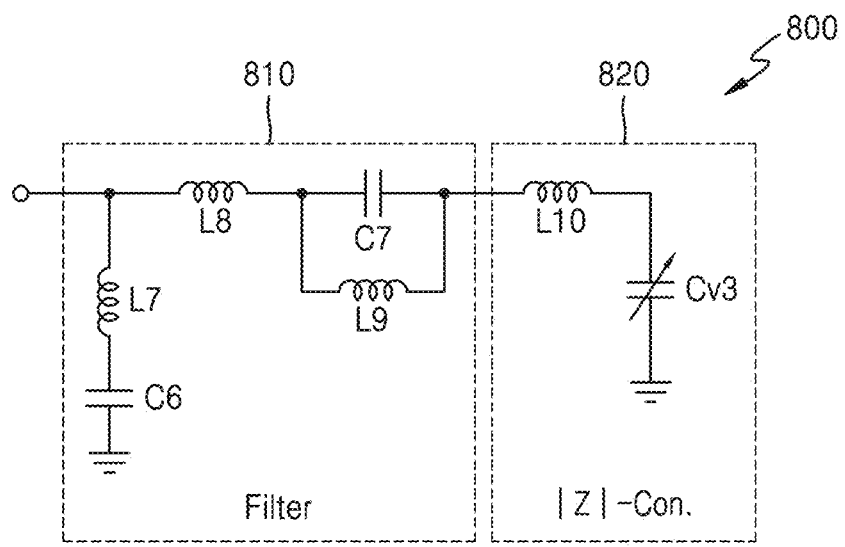

As shown in FIG. 12D, the edge control circuit 800 may include the filter circuit 810 and the impedance control circuit 820. The filter circuit 810 may include a sixth capacitor C6, a seventh capacitor C7, and seventh through ninth inductors L7 through L9, which may be connected in series and/or parallel to one another. The impedance control circuit 820 may have a circuit structure in which a tenth inductor L10 and a third variable capacitor Cv3 are connected in series. However, the circuit structure of the filter circuit 810 and the impedance control circuit 820 is not limited to that shown in FIG. 12D.

While the inventive concepts have been particularly shown and described with reference to embodiments thereof, it will be understood that various changes in form and details may be made therein without departing from the spirit and scope of the following claims.

What is claimed is:

1. A plasma control apparatus comprising:
a transmission line configured to deliver radio frequency (RF) power to a plasma chamber through at least two frequencies;
a matching circuit configured to control impedance for maximum delivery of the RF power; and
a plasma control circuit configured to selectively and independently control harmonics at a very high frequency (VHF) among the at least two frequencies, and to control plasma distribution in the plasma chamber by producing resonance for the harmonics.

2. The plasma control apparatus of claim 1, wherein the plasma control circuit includes a resonance circuit and a filter circuit.

3. The plasma control apparatus of claim 2, wherein the resonance circuit is configured to produce resonance for each of the harmonics.

4. The plasma control apparatus of claim 2, wherein the resonance circuit includes at least one selected from a series resonance circuit and a parallel resonance circuit.

5. The plasma control apparatus of claim 2, wherein the filter circuit is configured to perform filtering on a fundamental and harmonics at each of the at least two frequencies.

6. The plasma control apparatus of claim 2, wherein the filter circuit includes at least one selected from a low pass filter (LPF) and a high pass filter (HPF).

7. The plasma control apparatus of claim 2, wherein the filter circuit includes a low pass filter (LPF) and a high pass filter (HPF),
the LPF is between the matching circuit and the plasma chamber, and
the HPF and the resonance circuit are between the LPF and the plasma chamber.

8. The plasma control apparatus of claim 1, wherein the plasma control circuit is configured to produce the resonance for the harmonics, by taking into account impedance of each of the matching circuit and the transmission line.

9. The plasma control apparatus of claim 8, wherein the plasma control circuit is configured to not influence delivery of the RF power by the matching circuit and the transmission line.

10. The plasma control apparatus of claim 1, wherein the plasma control circuit is between the matching circuit and the plasma chamber or in the matching circuit.

11. A plasma control apparatus comprising:
a plasma control circuit configured to control plasma distribution in a plasma chamber using resonance for harmonics at a very high frequency (VHF), the plasma control circuit including
a resonance circuit configured to produce the resonance for the harmonics at VHF among frequencies of radio frequency (RF) power delivered to the plasma chamber; and
a filter circuit configured to perform filtering on a fundamental and harmonics with respect to the frequencies of the RF power.

12. The plasma control apparatus of claim 11, wherein the resonance circuit is configured to produce resonance for each of the harmonics at the VHF, and
the filter circuit is configured to perform filtering on the fundamental and the harmonics at each of the frequencies.

13. The plasma control apparatus of claim 11, further comprising:
a matching circuit configured to control an impedance to the plasma chamber; and
a transmission line configured to deliver the RF power to the plasma chamber,
wherein the resonance circuit is configured to produce the resonance for the harmonics at the VHF, by taking into account impedance of each of the matching circuit and the transmission linematching circuit.

14. The plasma control apparatus of claim 13, wherein the plasma control circuit is configured to selectively and independently control the harmonics at the VHF and not influence delivery of the RF power by the matching circuit and the transmission line.

15. The plasma control apparatus of claim 11, wherein the plasma control circuit is configured to make the plasma distribution uniform by lowering plasma density at a central portion of the plasma chamber using the resonance circuit.

16. A plasma processing system comprising:
a radio frequency (RF) power source configured to generate RF power having at least two frequencies;
a plasma chamber configured to allow plasma to be generated therein;
a transmission line configured to deliver the RF power to the plasma chamber;
a matching circuit configured to control impedance of the RF power; and
a plasma control circuit configured to selectively and independently control harmonics at a very high frequency (VHF) among the at least two frequencies and to control plasma distribution in the plasma chamber by producing resonance for the harmonics.

17. The plasma processing system of claim 16, wherein the plasma control circuit includes a resonance circuit and a filter circuit,
the resonance circuit is configured to produce resonance for each of the harmonics, and
the filter circuit is configured to perform filtering on a fundamental and harmonics at each of the at least two frequencies.

18. The plasma processing system of claim 16, wherein the plasma control circuit is configured to produce the resonance for the harmonics, by taking into account impedance of each of the matching circuit and the transmission line, and is configured to not influence delivery of the RF power by the matching circuit and the transmission line.

19. The plasma processing system of claim 16, wherein the plasma control circuit is between the matching circuit and the plasma chamber or in the matching circuit.

20. The plasma processing system of claim 16, wherein the plasma chamber includes a top electrode and a bottom electrode, and
the RF power is delivered to the plasma chamber through at least one selected from the top electrode and the bottom electrode.

* * * * *